(12) United States Patent
Yamawaku et al.

(10) Patent No.: US 8,845,853 B2
(45) Date of Patent: Sep. 30, 2014

(54) SUBSTRATE PROCESSING APPARATUS AND SUBSTRATE PROCESSING METHOD

(75) Inventors: Jun Yamawaku, Nirasaki (JP); Tsuyoshi Moriya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1485 days.

(21) Appl. No.: 12/042,661

(22) Filed: Mar. 5, 2008

(65) Prior Publication Data
US 2008/0237182 A1 Oct. 2, 2008

Related U.S. Application Data

(60) Provisional application No. 60/954,175, filed on Aug. 6, 2007.

(30) Foreign Application Priority Data

Mar. 26, 2007 (JP) ................. 2007-079165

(51) Int. Cl.
C23C 16/50 (2006.01)
C23C 16/00 (2006.01)
C23F 1/00 (2006.01)
H01L 21/306 (2006.01)
H01J 37/32 (2006.01)
H01L 21/67 (2006.01)
H01L 21/683 (2006.01)

(52) U.S. Cl.
CPC ......... H01L 21/6831 (2013.01); H01J 37/3244 (2013.01); H01L 21/67069 (2013.01); H01L 21/67109 (2013.01); H01J 37/32642 (2013.01)
USPC ................... 156/345.27; 156/345.51; 118/728

(58) Field of Classification Search
USPC ........ 117/84, 85, 86, 200, 201, 202; 118/695, 118/696, 708, 715, 716, 723 R, 722, 724, 118/725; 156/345.1, 345.13, 345.24, 156/345.25, 345.26, 345.27, 345.28, 156/345.34, 345.51, 345.52, 345.53; 216/58, 9, 60, 61, 83, 84, 85, 86; 427/248.1, 446, 457, 585; 438/14, 15, 438/16, 17, 18, 689
See application file for complete search history.

(56) References Cited

U.S. PATENT DOCUMENTS

| 6,468,384 B1 | 10/2002 | Singh et al. |
| 6,656,540 B2 * | 12/2003 | Sakamoto et al. ............ 427/564 |
| 2005/0102108 A1 * | 5/2005 | Ramachandran et al. ...... 702/30 |
| 2005/0172904 A1 * | 8/2005 | Koshimizu et al. ........... 118/728 |
| 2005/0173067 A1 * | 8/2005 | Lim .......................... 156/345.32 |
| 2008/0170842 A1 * | 7/2008 | Hunter et al. ................. 392/416 |

FOREIGN PATENT DOCUMENTS

| JP | 7-102371 | 4/1995 |
| JP | 2002-33311 | 1/2002 |
| JP | 2004-193567 | 7/2004 |
| JP | 2006-190741 | 7/2006 |

* cited by examiner

*Primary Examiner* — Maureen Gramaglia
*Assistant Examiner* — Tiffany Nuckols
(74) *Attorney, Agent, or Firm* — Oblon, Spivak, McClelland, Maier & Neustadt, L.L.P.

(57) ABSTRACT

A substrate processing apparatus that can improve the uniformity of plasma processing carried out on a wafer. The wafer is housed in a chamber of the substrate processing apparatus and subjected to plasma processing using plasma produced in the processing chamber. A temperature control mechanism jets a high-temperature gas toward at least part of an annular focus ring facing the plasma.

11 Claims, 4 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, and in particular to a substrate processing apparatus that subjects a substrate housed in a processing chamber to plasma processing.

2. Description of the Related Art

Substrate processing apparatuses that subject a wafer as a substrate to plasma processing such as etching processing have a processing chamber (hereinafter referred to as the "chamber") that houses a wafer and can be evacuated, and a mounting stage (hereinafter referred to as the "susceptor") on which the wafer is mounted during the etching processing. In the evacuated chamber, plasma is produced, and the wafer is etched by the plasma. The susceptor has a temperature control mechanism to control the temperature of the wafer.

In the susceptor, an annular focus ring made of, for example, silicon is provided so as to surround a peripheral portion of the mounted wafer. The focus ring focuses plasma in the chamber onto the wafer.

When the wafer is subjected to the plasma processing, the temperature of the wafer rises because it is exposed to heat from the plasma, and hence the temperature control mechanism of the susceptor cools the wafer so as to maintain the temperature of the wafer constant, thus improving the uniformity of the plasma processing (see, for example, Japanese Laid-Open Patent Publication (Kokai) No. 2004-193567).

However, in the conventional substrate processing apparatuses described above, temperature management is not carried out for an in-chamber component such as the focus ring located in the vicinity of the plasma, and hence heat transfers between the focus ring and the plasma, and also, heat transfers between the peripheral portion of the wafer and the focus ring. As a result, the state of the plasma changes, and the state of the plasma on the wafer becomes unstable.

Generally, in substrate processing apparatuses, the uniformity of plasma processing carried out on a wafer can be improved by maintaining plasma on the wafer in a desired state and maintaining the processing temperature of the wafer uniform over the surface thereof. It is thus impossible for the conventional substrate processing apparatuses to improve the uniformity of the plasma processing carried out on a wafer.

SUMMARY OF THE INVENTION

The present invention provides a substrate processing apparatus and a substrate processing method that can improve the uniformity of plasma processing carried out on a substrate.

Accordingly, in a first aspect of the present invention, there is provided a substrate processing apparatus that has a processing chamber in which a substrate is housed, and subjects the substrate housed in the processing chamber to plasma processing using plasma produced in the processing chamber, comprising a jetting mechanism adapted to jet a temperature-controlled gas toward at least part of an in-processing chamber component facing the plasma.

According to the first aspect of the present invention, the temperature-controlled gas is jetted toward at least part of the in-processing chamber component facing the plasma. Thus, before the substrate is housed in the processing chamber, the temperature of the in-processing chamber component can be controlled to a predetermined in-processing temperature. As a result, when the substrate is housed in the processing chamber and subjected to the plasma processing, the amount of heat transferred between the plasma and the in-processing chamber component is minimized, so that the plasma on the substrate can be maintained in a desired state. Further, the amount of heat transferred between the peripheral portion of the substrate and the in-processing chamber component is also minimized, so that the processing temperature of the substrate can be maintained uniform over the surface thereof. As a result, the uniformity of the plasma processing carried out on the substrate can be improved.

The first aspect of the present invention can provide a substrate processing apparatus, wherein the jetting mechanism comprises a nozzle that jets the temperature-controlled gas.

According to the first aspect of the present invention, the temperature-controlled gas is jetted from the nozzle. Thus, the temperature of the in-processing chamber component can be controlled in an efficient manner.

The first aspect of the present invention can provide a substrate processing apparatus, wherein the jetting mechanism comprises a temperature measurement device that measures a temperature of the in-processing chamber component.

According to the first aspect of the present invention, the temperature of the in-processing chamber component is measured. Thus, the temperature of the in-processing chamber component can be controlled to a predetermined in-processing temperature in an efficient manner.

The first aspect of the present invention can provide a substrate processing apparatus, wherein the in-processing chamber component is an annular focus ring that is disposed on a mounting stage disposed in the processing chamber such as to surround a peripheral portion of the substrate mounted on the mounting stage.

According to the first aspect of the present invention, the temperature-controlled gas is jetted to at least part of the focus ring. Thus, before the substrate is housed in the processing chamber, the temperature of the focus ring can be controlled to a predetermined in-processing temperature. As a result, when the substrate is housed in the processing chamber and subjected to the plasma processing, the amount of heat transferred between the plasma and the focus ring is minimized, so that the plasma on the substrate can be maintained in a desired state. Further, the amount of heat transferred between the peripheral portion of the substrate and the focus ring is also minimized, so that the processing temperature of the substrate can be maintained uniform over the surface thereof. As a result, the uniformity of the plasma processing can be improved.

The first aspect of the present invention can provide a substrate processing apparatus, wherein the temperature-controlled gas is a high-temperature gas.

According to the first aspect of the present invention, the high-temperature gas is jetted as the temperature-controlled gas. Thus, the temperature of the in-processing chamber component can be quickly controlled.

Accordingly, in a second aspect of the present invention, there is provided a substrate processing apparatus comprising a processing chamber in which a substrate is housed, a mounting stage that is disposed in the processing chamber and has the substrate mounted thereon, an annular focus ring that is disposed on the mounting stage such as to surround a peripheral portion of the mounted substrate, a gas jetting system that is disposed such as to face the mounting stage and jets a processing gas into the processing chamber, and carring out plasma processing on the substrate housed in the processing chamber, wherein the gas jetting system jets a temperature-controlled gas toward at least part of the focus ring.

The second aspect of the present invention can provide a substrate processing apparatus further comprising a temperature measurement device that measures a temperature of the focus ring.

According to the second aspect of the present invention, the temperature of the focus ring is measured. Thus, the temperature of the focus ring can be accurately controlled to a predetermined in-processing temperature.

Accordingly, in a third aspect of the present invention, there is provided a substrate processing apparatus comprising a processing chamber in which a substrate is housed, a mounting stage that is disposed in the processing chamber and has the substrate mounted thereon, and an annular focus ring that is disposed on the mounting stage such as to surround a peripheral portion of the mounted substrate, and carring out plasma processing on the substrate housed in the processing chamber, wherein a jetting hole through which a temperature-controlled gas is jetted toward at least part of the focus ring is formed in the mounting stage.

Accordingly, in a fourth aspect of the present invention, there is provided a substrate processing method carried out by a substrate processing apparatus that has a processing chamber in which a substrate is housed and subjects the substrate housed in the processing chamber to plasma processing using plasma produced in the processing chamber, comprising a jetting step of jetting a temperature-controlled gas toward at least part of an in-processing chamber component facing the plasma before the substrate is housed in the processing chamber.

The fourth aspect of the present invention can provide a substrate processing method, wherein the jetting step comprises a measurement step of measuring a temperature of the in-processing chamber component.

The fourth aspect of the present invention can provide a substrate processing method further comprising a pressure control step of controlling a pressure in the processing chamber to 665 to 1330 Pa (5 to 10 Torr) before execution of the jetting step.

According to the fourth aspect of the present invention, the pressure in the processing chamber is controlled to 665 to 1330 Pa (5 to 10 Torr). As a result, the efficiency of the transfer of heat from the temperature-controlled gas, which is jetted toward the in-processing chamber component, to the in-processing chamber component can be optimized.

The fourth aspect of the present invention can provide a substrate processing method further comprising a leaving step of leaving the in-processing chamber component, to which the temperature-controlled gas has been jetted in the jetting step, as it is for at least one second after execution of the jetting step and before the substrate is housed in the processing chamber.

According to the fourth aspect of the present invention, the in-processing chamber component, to which the temperature-controlled gas has been jetted, is left as it is for at least one second. As a result, heat transferred from the temperature-controlled gas is reliably uniformly distributed over the entire in-processing chamber component, and hence the temperature of the in-processing chamber component can be reliably made uniform.

The fourth aspect of the present invention can provide a substrate processing method, wherein the in-processing chamber component is an annular focus ring that is disposed on a mounting stage disposed in the processing chamber such as to surround a peripheral portion of the substrate mounted on the mounting stage.

The fourth aspect of the present invention can provide a substrate processing method, wherein the temperature-controlled gas is a high-temperature gas.

The features and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

First, a description will be given of a substrate processing apparatus according to a first embodiment of the present invention.

Figure 1:
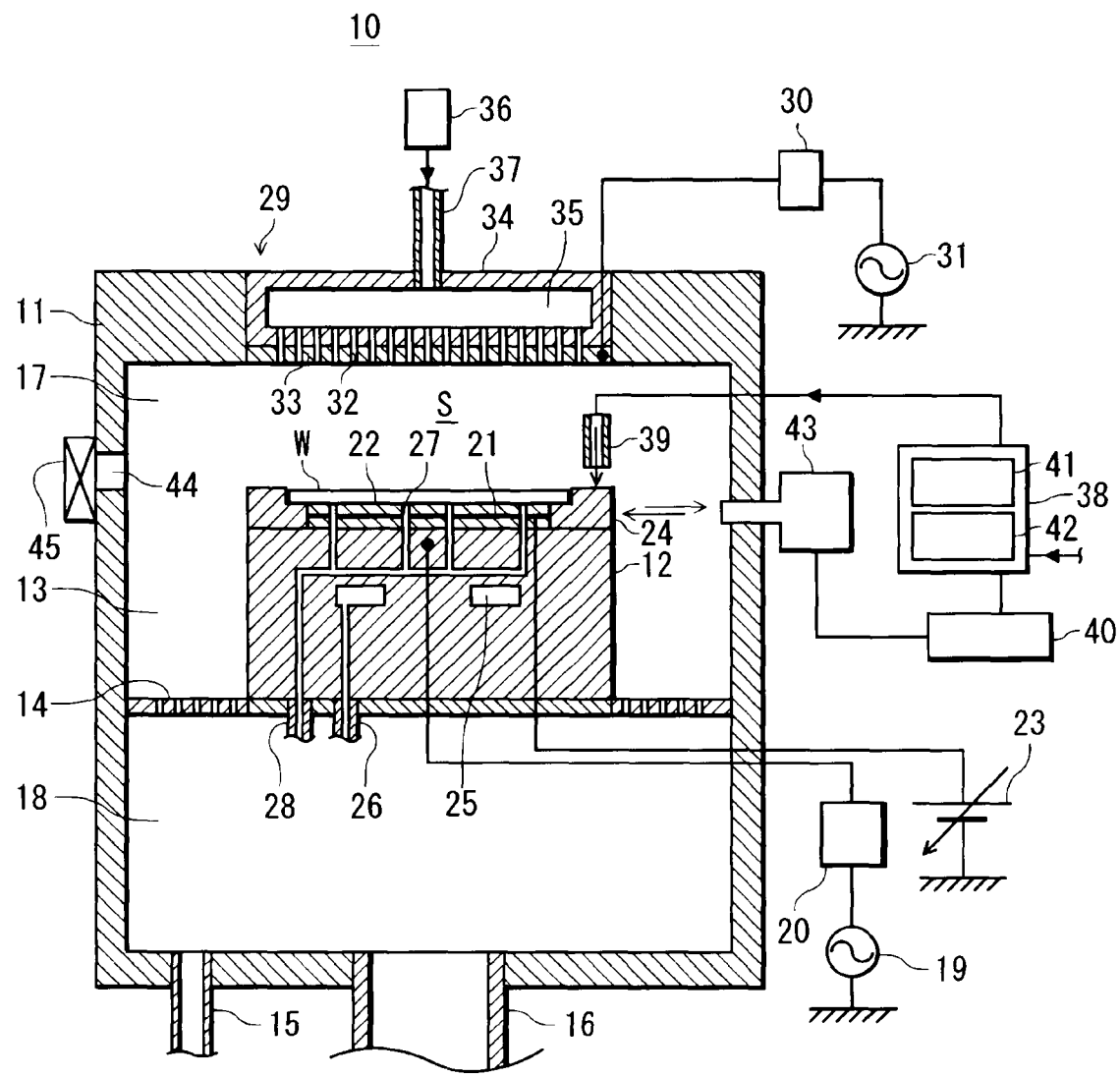
FIG. 1 is a view schematically showing the construction of a substrate processing apparatus according to a first embodiment of the present invention.

FIG. 1 is a view schematically showing the construction of a substrate processing apparatus according to the present embodiment. The substrate processing apparatus is constructed such as to carry out etching processing as plasma processing on a wafer as a substrate for a semiconductor device.

As shown in FIG. 1, the substrate processing apparatus 10 has a chamber 11 (processing chamber) in which a semiconductor device wafer (hereinafter referred to merely as a "wafer") W having a diameter of, for example, 300 mm is housed. A cylindrical susceptor 12 is disposed in the substrate processing chamber 11 as a mounting stage on which the wafer W is mounted. In the substrate processing apparatus 10, a side exhaust path 13 that acts as a flow path through which gas above the susceptor 12 is exhausted out of the chamber 11 is formed between an inner side wall of the chamber 11 and the side face of the susceptor 12. An exhaust plate 14 is disposed part way along the side exhaust path 13. An inner wall surface of the chamber 11 is covered with quarts or yttria ($Y_2O_3$).

The exhaust plate 14 is a plate-like member having a number of holes therein and functions as a partition plate which partitions the chamber 11 into an upper portion and a lower portion. In a processing space S, described below, of the upper portion (hereinafter referred to as the "reaction chamber") 17 of the chamber 11 partitioned by the exhaust plate 14, plasma is produced as will be described later. In the lower portion (hereinafter referred to as the "exhaust chamber (manifold)") 18 of the chamber 11, a roughing exhaust pipe 15 and a main exhaust pipe 16 which exhaust gas out of the chamber 11 are opened. The roughing exhaust pipe 15 has a DP (dry pump) (not shown) connected thereto, and the main exhaust pipe 16 has a TMP (turbo-molecular pump) (not shown) connected thereto via an APC valve (adaptive pressure control valve) (not shown) comprising a variable butterfly valve. The exhaust plate 14 captures or reflects ions and radicals produced in the processing space S of the reaction chamber 17 to prevent leakage of the ions and radicals into the manifold 18.

The roughing exhaust pipe 15 and the main exhaust pipe 16 exhaust gas in the reaction chamber 17 out of the chamber 11 via the manifold 18. Specifically, the roughing exhaust pipe 15 reduces the pressure in the chamber 11 from atmospheric pressure down to a low vacuum state, and the main exhaust pipe 16 is operated in collaboration with the roughing exhaust pipe 15 to reduce the pressure in the chamber 11 from atmospheric pressure down to a high vacuum state (e.g. a pressure of not more than 133 Pa (1 Torr)), which is at a lower pressure than the low vacuum state. The above APC valve controls the pressure in the chamber 11.

A lower radio frequency power source 19 is connected to the susceptor 12 via a lower matcher 20. The lower radio frequency power source 19 applies predetermined radio frequency electrical power to the susceptor 12. The susceptor 12 thus acts as a lower electrode. The lower matcher 20 reduces reflection of the radio frequency electrical power from the susceptor 12 so as to maximize the efficiency of the supply of the radio frequency electrical power into the susceptor 12.

An electrostatic chuck 22 having an electrostatic electrode plate 21 therein is provided in an upper portion of the susceptor 12. The electrostatic chuck 22 is made of aluminum, and ceramic or the like is thermally sprayed on an upper surface of the electrostatic chuck 22. When a wafer W is mounted on the susceptor 12, the wafer W is disposed on the upper surface of the electrostatic chuck 22.

Moreover, a DC power source 23 is electrically connected to the electrostatic electrode plate 21 of the electrostatic chuck 22. Upon a positive high DC voltage being applied to the electrostatic electrode plate 21, a negative potential is produced on a surface of the wafer W which faces the electrostatic chuck 22 (hereinafter referred to as "the rear surface of the wafer W"). A potential difference thus arises between the electrostatic electrode plate 21 and the rear surface of the wafer W, and hence the wafer W is attracted to and held on the upper surface of the electrostatic chuck 22 through a Coulomb force or a Johnsen-Rahbek force due to the potential difference. An annular focus ring 24 (in-processing chamber component) is disposed on an upper portion of the susceptor 12 such as to surround the wafer W attracted to and held on the upper surface of the electrostatic chuck 22. The focus ring 24 is made of a conductive member such as silicon. The focus ring 24 faces plasma produced in the processing space S, and focuses the plasma in the processing space S toward a front surface of the wafer W, thus improving the efficiency of the etching processing.

An annular coolant chamber 25 that extends, for example, in a circumferential direction of the susceptor 12 is provided inside the susceptor 12. A coolant, for example, cooling water or a Galden (registered trademark) fluid, at a low temperature is circulated through the coolant chamber 25 from a chiller unit (not shown). The susceptor 12 cooled by the low-temperature coolant cools the wafer W via the electrostatic chuck 22. The temperature of the wafer W is controlled mainly through the temperature and flow rate of the coolant circulated through the coolant chamber 25.

A plurality of heat transfer gas supply holes 27 are opened to a portion of the upper surface of the electrostatic chuck 22 on which the wafer W is attracted and held (hereinafter referred to as the "attracting surface"). The heat transfer gas supply holes 27 are connected to a heat transfer gas supply unit (not shown) by a heat transfer gas supply line 28. The heat transfer gas supply unit supplies helium (He) gas as a heat transfer gas via the heat transfer gas supply holes 27 into a gap between the attracting surface and the rear surface of the wafer W. The helium gas supplied into the gap between the attracting surface and the rear surface of the wafer W effectively transfers heat from the wafer W to the electrostatic chuck 22.

A gas introducing shower head 29 is disposed in a ceiling portion of the chamber 11 such as to face the susceptor 12. An upper radio frequency power source 31 is connected to the gas introducing shower head 29 via an upper matcher 30 and applies predetermined radio frequency electrical power to the gas introducing shower head 29. The gas introducing shower head 29 thus acts as an upper electrode. The upper matcher 30 has a similar function to the lower matcher 20 described above.

The gas introducing shower head 29 is comprised of a ceiling electrode plate 33 having a number of gas holes 32 therein, and an electrode support 34 that detachably supports the ceiling electrode plate 33. A buffer chamber 35 is provided inside the electrode support 34, and a processing gas introducing pipe 37 that introduces a processing gas from a processing gas supply source 36 is connected to the buffer chamber 35. The gas introducing shower head 29 supplies a processing gas supplied into the buffer chamber 35 from the processing gas introducing pipe 37 into the reaction chamber 17 via the gas holes 32.

In the substrate processing apparatus 10, after a wafer W that has not yet been subjected to the etching processing is housed in the chamber 11 and attracted to and held on the upper surface of the electrostatic chuck 22, radio frequency electrical power is applied to the susceptor 12 and the gas introducing shower head 29, so that the radio frequency electrical power is applied to the processing space S between the susceptor 12 and the gas introducing shower head 29. As a result, in the processing space S, the processing gas supplied from the gas introducing shower head 29 is turned into high-density plasma so as to produce ions and radicals, whereby the wafer W that has not yet been subjected to the etching processing is subjected to the etching processing by the ions and radicals.

A nozzle 39 connected to a high-temperature gas introducing unit 38 is disposed above the focus ring 24 in the reaction chamber 17. The nozzle 39 jets a high-temperature gas (temperature-controlled gas), which has been controlled to a predetermined temperature and introduced in from the high-temperature gas introducing unit 38, toward at least part of the focus ring 24. At this time, heat of the high-temperature gas is transferred to the focus ring 24, so that the temperature of the focus ring 24 is increased.

The high-temperature gas introducing unit 38 has a gas temperature control unit 41 such as a heater that controls a gas supplied from a gas supply source (not shown), for example, an inert gas with high heat transference and low reactivity to a predetermined temperature in accordance with a control signal received from a control unit 40, and an introduction control unit 42 that controls ON/OFF of introduction of the high-temperature gas, whose temperature has been controlled by the gas temperature control unit 41, in accordance with a control signal received from the control unit 40.

A temperature measurement device 43 that measures the temperature of the focus ring 24 is disposed in a side wall of the chamber 11. The temperature measurement device 43 uses, for example, a low-coherence interferometer whose basic structure is based on the structure of a Michelson interferometer, and measures the temperature of the focus ring 24 by referring to a change in the interference waveform of reference light branched from measured light irradiated toward the focus ring 24 and reflected light of the measured light from the focus ring 24. Moreover, the temperature measurement device 43 transmits a temperature signal based on the measured temperature of the focus ring 24 to the control unit 40. It should be noted that the temperature measurement device 43 may be provided inside the susceptor 12, for measuring the temperature of the focus ring 24 from the rear surface thereof. Moreover, the temperature measurement device 43 is not limited to be the one using the low-coherence interferometer described above, but rather may instead be a temperature measurement sensor or the like which observes the front surface of the focus ring 24 from above and measures the temperature thereof.

Based on the temperature signal received from the temperature measurement device 43, the control unit 40 transmits a control signal to the gas temperature control unit 41 and the introduction control unit 42 so that the temperature of the focus ring 24 can become equal to a predetermined in-processing temperature, specifically a temperature at which the amount of heat transferred between the plasma produced in the processing space S and the focus ring 24 is minimized, and the amount of heat transferred between the peripheral portion of the wafer W and the focus ring 24 is minimized.

In the substrate processing apparatus 10, the nozzle 39, high-temperature gas introducing unit 38, temperature measurement device 43, and control unit 40 constitute a temperature control mechanism (jetting mechanism) that controls the temperature of the focus ring 24 to the above described predetermined in-processing temperature.

In the substrate processing apparatus 10, before a wafer W that has not yet been subjected to the etching processing is housed in the chamber 11, the temperature control mechanism described above controls the temperature of the focus ring 24 to the predetermined in-processing temperature described above.

A transfer port 44 for use in transferring the wafers W into and out from the chamber 11 is provided in the side wall of the chamber 11, and a gate valve 45 for opening and closing the transfer port 44 is provided in the transfer port 44.

Operation of the component elements of the substrate processing apparatus 10 described above is controlled in accordance with a program for the etching processing by a CPU of a control unit (not shown) of the substrate processing apparatus 10.

Next, a description will be given of substrate processing carried out by the substrate processing apparatus according to the present embodiment.

Figure 2:
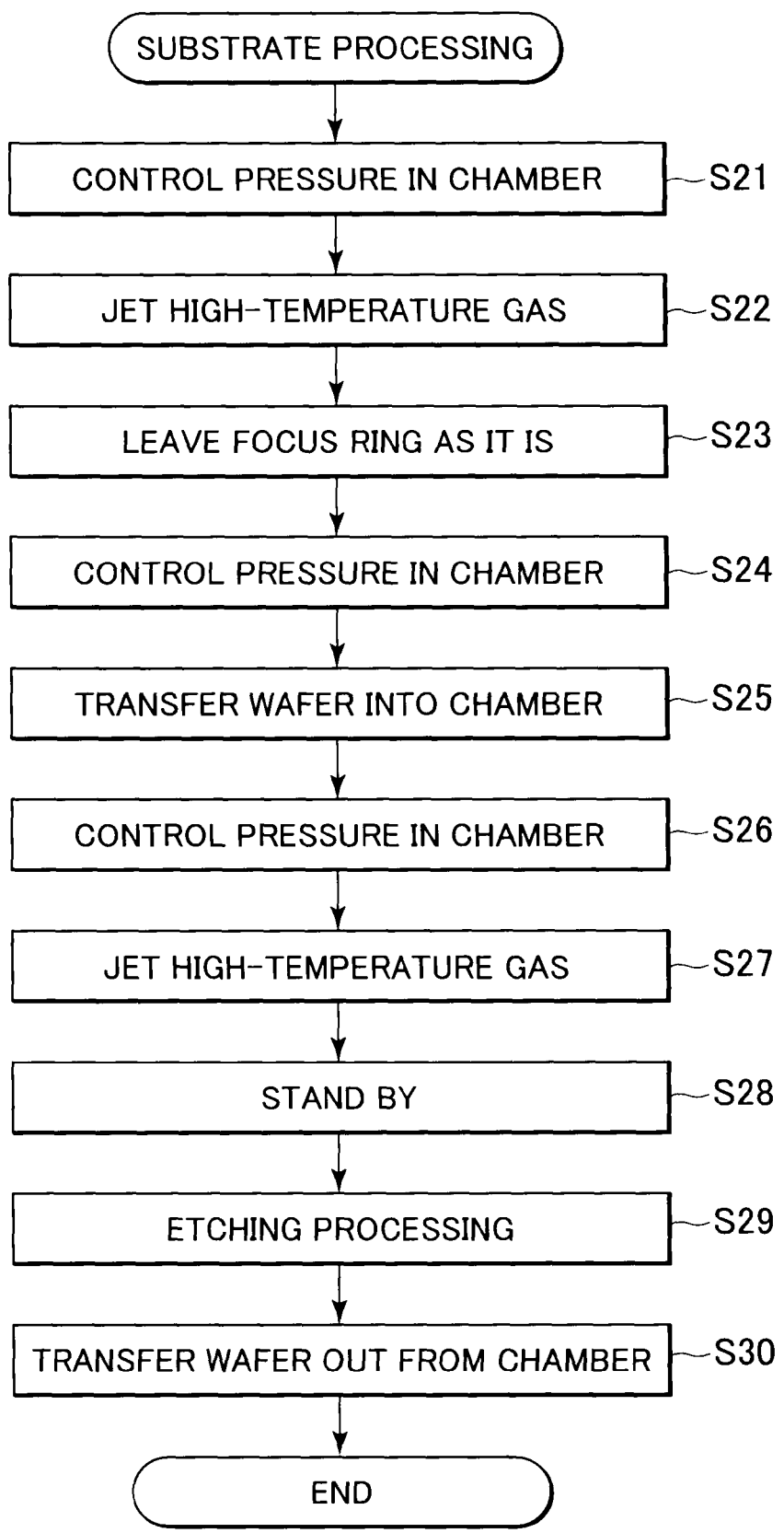
FIG. 2 is a flow chart of substrate processing carried out by the substrate processing apparatus in FIG. 1.

FIG. 2 is a flow chart of substrate processing carried out by the substrate processing apparatus 10 in FIG. 1.

As shown in FIG. 2, first, before a wafer W that has not yet been subjected to the etching processing is housed in the chamber 11, the pressure in the chamber 11 is controlled to a pressure of, for example, 665 to 1330 Pa (5 to 10 Torr) so as to optimize the efficiency of heat transfer from a high-temperature gas, which is jetted from the nozzle 39 toward the focus ring 24 in a step S22, described later, to the focus ring 24 (step S21).

Next, the temperature of the focus ring 24 is measured using the temperature measurement device 43, and a high-temperature gas is jetted from the nozzle 39 toward at least part of the focus ring 24 (step S22). In the step S22, the temperature of the focus ring 24 is controlled to the above-mentioned predetermined in-processing temperature by the above described temperature control mechanism. It should be noted that the focus ring 24 is made of, for example, silicon, which has high heat transference, and hence even when the high-temperature gas is jetted to part of the focus ring 24, heat transferred from the high-temperature gas is uniformly distributed over the entire focus ring 24, so that the temperature of the entire focus ring 24 can be uniformly increased.

Then, the focus ring 24 to which the high-temperature gas was jetted in the step S22 is left as it is for at least one second (step S23). As a result, the heat transferred from the high-temperature gas in the step S22 is reliably uniformly distributed over the entire focus ring 24, so that the temperature of the entire focus ring 24 can be reliably made uniform.

Then, the pressure in the chamber 11 is controlled to a pressure suitable for transfer of the wafer W (step S24). As a result, gas as well as particles can be prevented from flowing into the chamber 11 from outside when the wafer W is transferred into the chamber 11.

Then, the wafer W that has not yet been subjected to the etching processing is transferred into the chamber 11 and mounted on the upper surface of the electrostatic chuck 22 (step S25).

Then, similarly to the step S21, the pressure in the chamber 11 is controlled to a pressure of, for example, 665 to 1330 Pa (5 to 10 Torr) so as to optimize the above described efficiency of heat transfer (step S26).

Then, similarly to the step S22, the temperature of the focus ring 24 is measured using the temperature measurement device 43, and a high-temperature gas is jetted from the nozzle 39 toward at least part of the focus ring 24 (step S27). In the step S27 as well, the temperature of the focus ring 24 is controlled to the predetermined in-processing temperature by the above described temperature control mechanism, and further the wafer W is made to stand by in the chamber 11 (step S28). As a result, the temperature of the focus ring 24 can be reliably controlled to the predetermined in-processing temperature.

Then, the wafer W is attracted to and held on the upper surface of the electrostatic chuck 22, and radio frequency electrical power is applied to the susceptor 12 and the gas introducing shower head 29, so that the radio frequency electrical power is applied into the processing space S between the susceptor 12 and the gas introducing shower head 29. As a result, in the processing space S, the processing gas supplied from the gas introducing shower head 29 is turned into high-density plasma, whereby ions and radicals are produced. The wafer W that has not yet been subjected to the etching processing is subjected to the etching processing by the ions and radicals (step S29). Here, because the temperature of the focus ring 24 has been controlled to the above-mentioned predetermined in-processing temperature, the amount of heat transferred between the plasma produced in the processing space S and the focus ring 24 is minimized, so that the plasma on the wafer W can be maintained in a desired state. Further, the amount of heat transferred between the peripheral portion of the wafer W and the focus ring 24 is also minimized, so that the processing temperature of the wafer W can be maintained uniform over the surface thereof.

Then, the wafer W that has been subjected to the etching processing is transferred out from the chamber 11 (step S30), followed by termination of the process.

According to the substrate processing of FIG. 2, before a wafer W that has not yet been subjected to the etching processing is housed in the chamber 11, the high-temperature gas is jetted from the nozzle 39 toward at least part of the focus ring 24, so that the temperature of the focus ring 24 is controlled to the predetermined in-processing temperature, and after that, the wafer W is transferred into the chamber 11 and subjected to the etching processing. Thus, the amount of heat transferred between the plasma produced in the processing space S and the focus ring 24 is minimized, so that the plasma on the wafer W can be maintained in a desired state. Further, the amount of heat transferred between the peripheral portion of the wafer W and the focus ring 24 is also minimized, so that the processing temperature of the wafer W can be maintained uniform over the surface thereof. As a result, the uniformity of the etching processing can be improved. Moreover, after the wafer W is transferred into the chamber 11, the high-temperature gas is jetted from the nozzle 39 toward at least part of the focus ring 24, and the wafer W is made to stand by in the chamber 11. As a result, the temperature of the focus ring 24 can be reliably controlled to the predetermined in-processing temperature.

In the present embodiment, the temperature of the focus ring 24 is controlled by jetting the high-temperature gas from the nozzle 39 to the focus ring 24, but rather may instead be controlled by irradiating laser to the focus ring 24.

Moreover, in the present embodiment, the high-temperature gas is jetted from the nozzle 39 toward the focus ring 24, but if there is any in-chamber component facing the plasma produced in the processing space other than the focus ring 24, the high-temperature gas is jetted toward the in-chamber component as well. As a result, the plasma on the wafer W can be reliably maintained in a desired state.

Next, a description will be given of a substrate processing apparatus according to a second embodiment of the present invention.

The present embodiment is basically the same as the first embodiment described above in terms of construction and operation, differing from the first embodiment in the construction of the temperature control mechanism. Features of the construction and operation that are the same as in the first embodiment will thus not be described, only features that are different from those of the first embodiment being described below.

Figure 3:
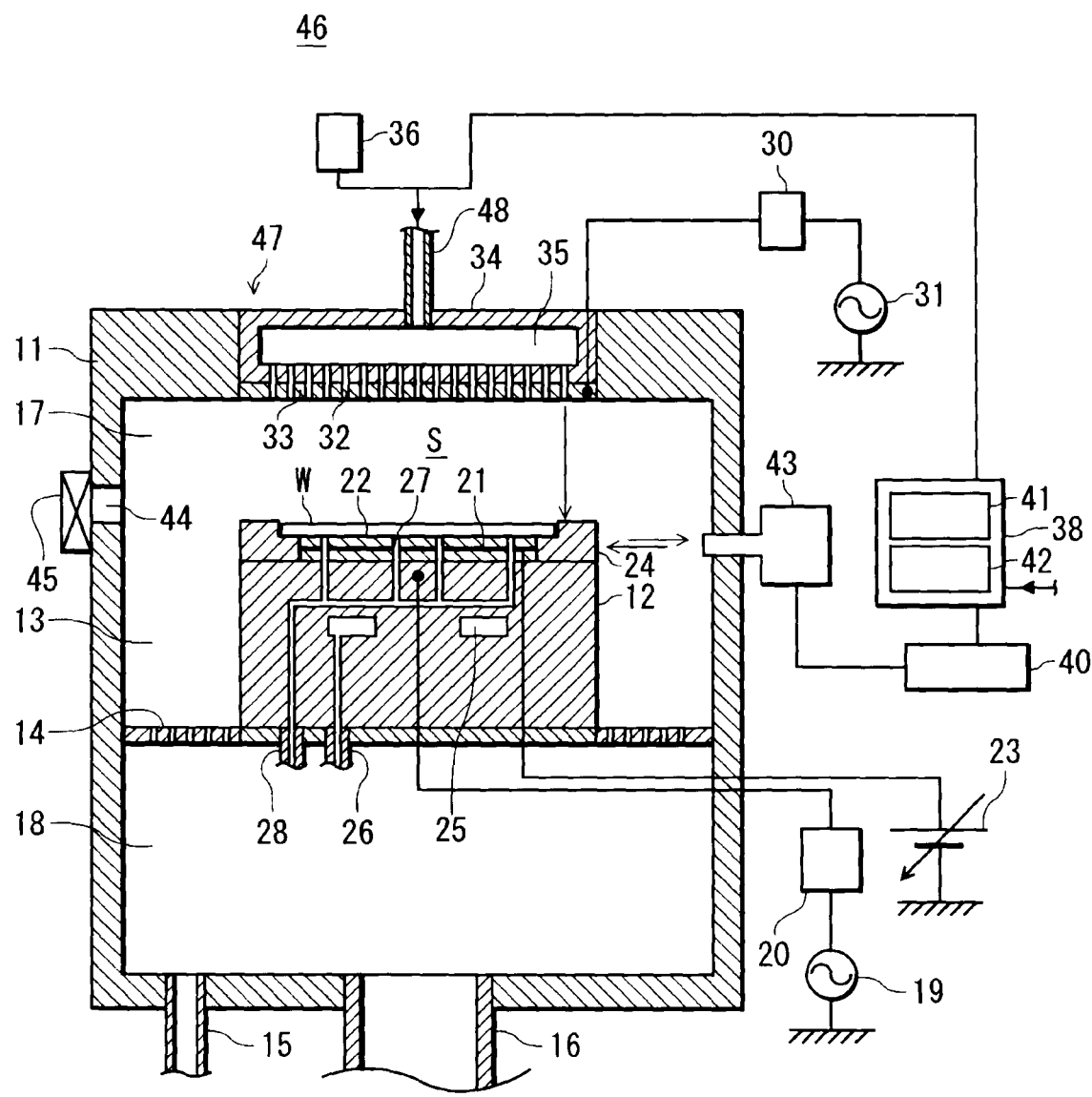
FIG. 3 is a view schematically showing the construction of a substrate processing apparatus according to a second embodiment of the present invention.

FIG. 3 is a view schematically showing the construction of the substrate processing apparatus according to the present embodiment.

As shown in FIG. 3, a gas jetting shower head 47 (gas jetting system) is disposed in the ceiling portion of the chamber 11 in the substrate processing apparatus 46.

A gas introducing pipe 48 that introduces a processing gas from a processing gas supply source 36 and introduces a high-temperature gas from the high-temperature gas introducing unit 38 is connected to the buffer chamber 35 of the gas jetting shower head 47. The gas jetting shower head 47 jets the processing gas introduced from the gas introducing pipe 48 into the buffer chamber 35 into the reaction chamber 17 via the gas holes 32 and also jets the high-temperature gas introduced from the gas introducing pipe 48 into the buffer chamber 35 toward at least part of the focus ring 24 via the gas holes 32.

In the present embodiment, the gas jetting shower head 47, high-temperature gas introducing unit 38, temperature measurement device 43, and control unit 40 constitute a temperature control mechanism (jetting mechanism) that controls the temperature of the focus ring 24 to a predetermined in-processing temperature.

According to the present embodiment, because the high-temperature gas is jetted from the gas jetting shower head 47, which jets the processing gas into the reaction chamber 17, toward at least part of the focus ring 24, the same effects as those of the first embodiment described above can be obtained using a simple construction when the wafer W is subjected to the etching processing.

Next, a description will be given of a substrate processing apparatus according to a third embodiment of the present invention.

The present embodiment is basically the same as the first and second embodiments described above in terms of construction and operation, differing from the first and second embodiments in the construction of the temperature control mechanism. Features of the construction and operation that are the same as in the first and second embodiments will thus not be described, only features that are different from those of the first and second embodiments being described below.

Figure 4:
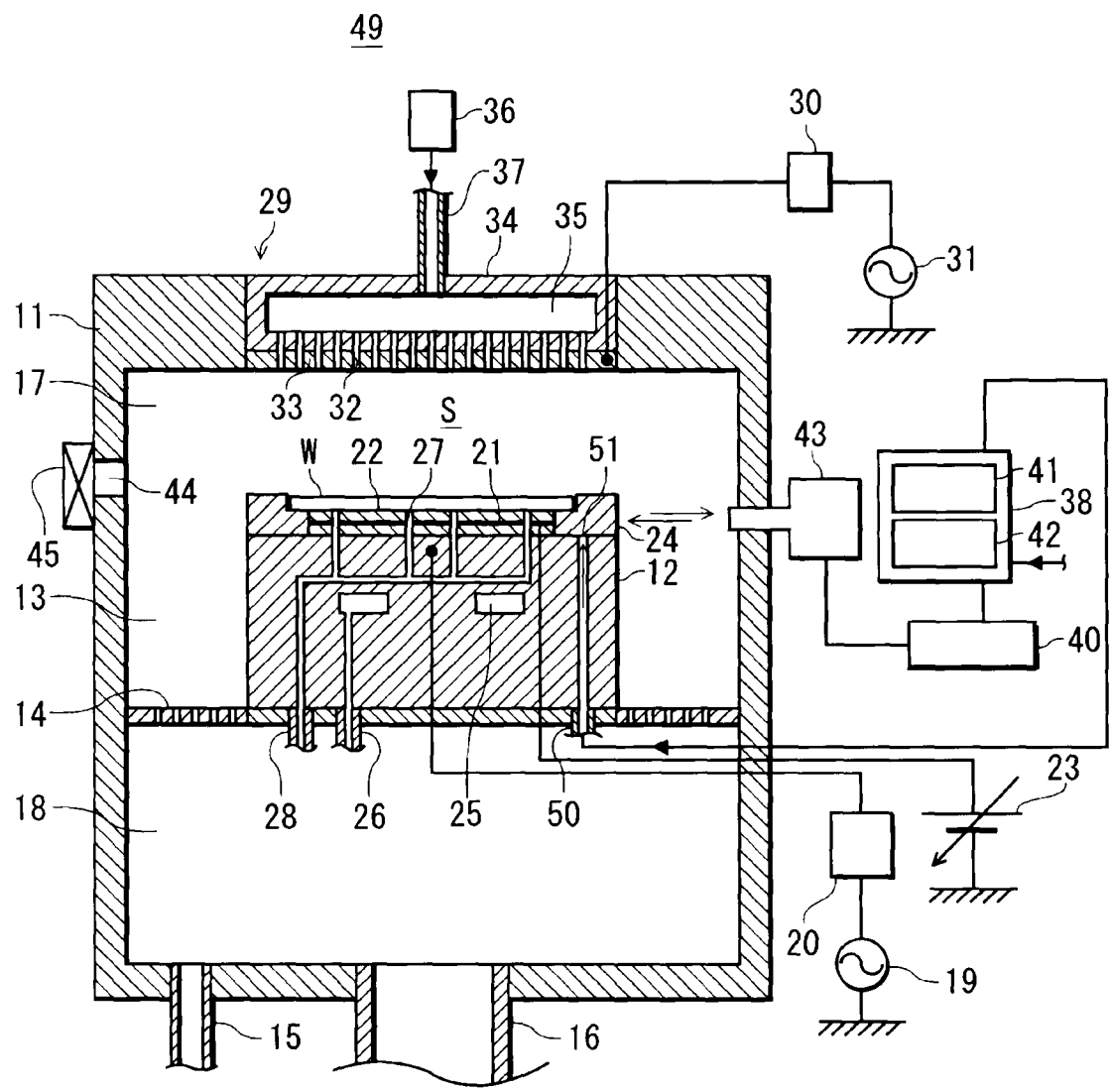
FIG. 4 is a view schematically showing the construction of a substrate processing apparatus according to a third embodiment of the present invention.

FIG. 4 is a view schematically showing the construction of the substrate processing apparatus according to the present embodiment.

As shown in FIG. 4, in the susceptor 12 of the substrate processing apparatus 49, there is formed a jetting hole 51 to which a gas introducing pipe 50 that introduces a high-temperature gas from the high-temperature gas introducing unit 38 is connected, and from which the high-temperature gas is jetted toward at least part of the focus ring 24.

In the present embodiment, the jetting hole 51, high-temperature gas introducing unit 38, temperature measurement device 43, and control unit 40 constitute a temperature control mechanism (jetting mechanism) that controls the temperature of the focus ring 24 to a predetermined in-processing temperature.

According to the present embodiment, because the high-temperature gas is jetted from the jetting hole 51 formed in the susceptor 12 toward at least part of the focus ring 24, the same effects as those of the first embodiment described above can be obtained using a simple construction when the wafer W is subjected to the etching processing.

In the above described embodiments, the substrates subjected to the etching processing are not limited to being wafers for semiconductor devices, but rather may instead be any of various substrates used in LCDs (Liquid Crystal Displays), FPDs (Flat Panel Displays) or the like, photomasks, CD substrates, printed substrates, or the like.

It is to be understood that the object of the present invention may also be accomplished by supplying a computer with a storage medium in which a program code of software, which realizes the functions of any of the above described embodiments is stored, and causing a CPU of the computer to read out and execute the program code stored in the storage medium.

In this case, the program code itself read from the storage medium realizes the functions of any of the above described embodiments, and hence the program code and a storage medium on which the program code is stored constitute the present invention.

Examples of the storage medium for supplying the program code include a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD–RW, or a DVD+RW, a magnetic tape, a nonvolatile memory card, and a ROM. Alternatively, the program code may be supplied by downloading from another computer, a database, or the like, not shown, connected to the Internet, a commercial network, a local area network, or the like.

Further, it is to be understood that the functions of any of the above described embodiments may be accomplished not only by executing a program code read out by a computer, but also by causing an OS (operating system) or the like which operates on the computer to perform a part or all of the actual operations based on instructions of the program code.

Further, it is to be understood that the functions of any of the above described embodiments may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

The form of the program code may be an object code, a program code executed by an interpreter, script data supplied to an OS, or the like.

What is claimed is:

1. A substrate processing apparatus that has a processing chamber in which a substrate is housed, and subjects the substrate housed in the processing chamber to plasma processing using plasma produced in the processing chamber, comprising:
   a jetting mechanism that jets a temperature-controlled gas toward only part of an focus ring facing the plasma from above the focus ring;
   a mounting stage that is disposed in the processing chamber, the substrate being mounted on said mounting stage; and
   a shower head that is disposed in a ceiling portion of the processing chamber,
   wherein the shower head faces said mounting stage and said shower head supplies a processing gas into the processing chamber, and
   said jetting mechanism is disposed in the processing chamber other than said mounting stage and said shower head and at a position in which a distance between said jetting mechanism and said mounting stage is shorter than that of said shower head and said mounting stage.

2. A substrate processing apparatus according to claim 1, wherein said jetting mechanism comprises a nozzle having a gas jetting port that jets the temperature-controlled gas, and the gas jetting port faces the focus ring.

3. A substrate processing apparatus according to claim 1, wherein said jetting mechanism comprises a temperature measurement device that measures a temperature of the focus ring.

4. A substrate processing apparatus according to claim 3, wherein said temperature measurement device is disposed in a side wall of the processing chamber.

5. A substrate processing apparatus according to claim 1, wherein the focus ring is disposed on the mounting stage disposed in the processing chamber, and the focus ring surrounds a peripheral portion of the substrate mounted on the mounting stage.

6. A substrate processing apparatus according to claim 1, wherein the temperature-controlled gas is a high-temperature gas, the high-temperature gas having a temperature at which an amount of heat transferred between the plasma produced in the processing chamber and the focus ring is minimized, and an amount of heat transferred between a peripheral portion of the substrate and the focus ring is minimized.

7. A substrate processing apparatus according to claim 1, wherein
   the focus ring is disposed on the mounting stage disposed in the processing chamber, the focus ring surrounds a peripheral portion of the substrate mounted on the mounting stage, and
   the jetting mechanism includes a temperature measurement device that measures the temperature of the focus ring, and a control unit that receives a signal indicating the temperature of the focus ring from the temperature measurement device and that controls the temperature of the focus ring based on said signal.

8. A substrate processing apparatus according to claim 7, wherein the control unit controls the temperature of the focus ring to be a temperature at which an amount of heat transferred between the plasma produced in the processing chamber and the focus ring is minimized, and an amount of heat transferred between a peripheral portion of the substrate and the focus ring is minimized.

9. A substrate processing apparatus according to claim 1, wherein the jetting mechanism includes a nozzle disposed above only the part of the focus ring.

10. A substrate processing apparatus according to claim 1, wherein the focus ring is disposed on the mounting stage disposed in the processing chamber, the focus ring surrounds a peripheral portion of the substrate mounted on the mounting stage, and the jetting mechanism includes a nozzle disposed above only part of the focus ring.

11. A substrate processing apparatus according to claim 1, wherein the temperature-controlled gas is introduced through a side wall of the processing chamber.

* * * * *